US009608528B2

(12) United States Patent
Nakazawa et al.

(10) Patent No.: US 9,608,528 B2
(45) Date of Patent: Mar. 28, 2017

(54) DC-DC CONVERTER APPARATUS

(71) Applicant: Hitachi Automotive Systems, Ltd., Hitachinaka-shi, Ibaraki (JP)

(72) Inventors: Tatsuya Nakazawa, Yokohama (JP); Yoshiharu Yamashita, Tokyo (JP); Hidenori Shinohara, Hitachinaka (JP); Akihiro Goto, Yokohama (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 14/655,211

(22) PCT Filed: Nov. 29, 2013

(86) PCT No.: PCT/JP2013/082124
§ 371 (c)(1),
(2) Date: Jun. 24, 2015

(87) PCT Pub. No.: WO2014/103614
PCT Pub. Date: Jul. 3, 2014

(65) Prior Publication Data
US 2015/0357923 A1 Dec. 10, 2015

(30) Foreign Application Priority Data

Dec. 28, 2012 (JP) .................................. 2012-287448

(51) Int. Cl.
*H01L 23/34* (2006.01)
*H01L 23/36* (2006.01)
(Continued)

(52) U.S. Cl.
CPC ......... *H02M 3/33507* (2013.01); *H02M 1/44* (2013.01); *H02M 3/28* (2013.01); *H02M 3/33576* (2013.01); *H05K 7/1432* (2013.01)

(58) Field of Classification Search
CPC ...... H02M 3/33576; H02M 3/28; H02M 1/44; H02M 3/33507; H05K 7/1432; H05K 7/20845; H05K 7/20863–7/2089; H05K 7/20909; H05K 7/20927–7/20936
See application file for complete search history.

(56) References Cited

U.S. PATENT DOCUMENTS

| 4,872,102 A * | 10/1989 | Getter | H05K 7/209 |
| | | | 307/150 |
| 2006/0227254 A1* | 10/2006 | Kato | F21V 29/70 |
| | | | 348/836 |

(Continued)

FOREIGN PATENT DOCUMENTS

JP  2003-180089 A  6/2003
JP  2007-6635 A  1/2007
(Continued)

OTHER PUBLICATIONS

Machine English Translation of JP 2011-182500.*
International Search Report (PCT/ISA/210) dated Mar. 11, 2014, with English translation (five (5) pages).

*Primary Examiner* — Timothy J Dole
*Assistant Examiner* — Sisay G Tiku
(74) *Attorney, Agent, or Firm* — Crowell & Moring LLP

(57) ABSTRACT

Objects of the invention are not to receive influence of an electromagnetic noise from a transformer and to reduce a possibility of breakage caused by shock or vibration. In a DC-DC converter apparatus of the invention, a shielding metal frame 300 is placed between a transformer 250 and a control circuit board assembly 240A housed in a case 101. A plate spring 311 attached to the metal frame 300 is pressed to cores 251 of the transformer 250 to fix the transformer 250 to a bottom portion 101a of the case 101. Heat generated from the transformer 250 is transmitted to the metal frame 300 and the bottom portion 101a of the case 101 and is then radiated.

10 Claims, 14 Drawing Sheets

(51) Int. Cl.
*H01L 23/367* (2006.01)
*H01L 23/373* (2006.01)
*H01L 23/40* (2006.01)
*H01L 23/433* (2006.01)
*H01L 23/467* (2006.01)
*H02M 3/335* (2006.01)
*H02M 1/44* (2007.01)
*H02M 3/28* (2006.01)
*H05K 7/14* (2006.01)

(56) References Cited

U.S. PATENT DOCUMENTS

| | | | |
|---|---|---|---|
| 2007/0096278 A1* | 5/2007 | Nakatsu | H01L 23/3675 257/678 |
| 2009/0243425 A1* | 10/2009 | Omori | H02K 5/148 310/239 |
| 2010/0164670 A1* | 7/2010 | Nakahori | H01F 27/2804 336/200 |
| 2012/0161911 A1 | 6/2012 | Moiseev et al. | |
| 2013/0082623 A1* | 4/2013 | Ishikita | H05B 37/0272 315/297 |
| 2014/0321065 A1* | 10/2014 | Nishimura | H05K 1/0203 361/722 |
| 2015/0208556 A1* | 7/2015 | Kodama | B60L 3/003 363/123 |
| 2015/0306960 A1* | 10/2015 | Sobu | H02M 1/44 307/10.1 |

FOREIGN PATENT DOCUMENTS

| | | |
|---|---|---|
| JP | 2009-303285 A | 12/2009 |
| JP | 2010-153722 A | 7/2010 |
| JP | 2011-182500 A | 9/2011 |
| JP | 2012-134424 A | 7/2012 |

* cited by examiner

DC-DC CONVERTER APPARATUS

TECHNICAL FIELD

The present invention relates to a DC-DC converter apparatus and particularly relates to a DC-DC converter apparatus including a transformer for converting an AC high voltage into an AC low voltage.

BACKGROUND ART

An electric vehicle and plug-in hybrid vehicle include an inverter device for performing motor drive with the use of a high voltage storage battery for power drive and a low voltage storage battery for operating auxiliaries such as lights of the vehicles and a radio. Such a vehicle includes a DC-DC converter apparatus for performing power conversion from a high voltage storage battery to a low voltage storage battery or performing power conversion from the low voltage storage battery to the high voltage storage battery.

The DC-DC converter apparatus includes a high-voltage side switching circuit for converting a DC voltage having a high voltage into an AC voltage, a transformer for converting an AC high voltage into an AC low voltage, a low-voltage side rectifier circuit for converting a low voltage AC voltage into a DC voltage, and a control circuit for controlling the high-voltage side switching circuit and the low-voltage side rectifier circuit.

In the DC-DC converter apparatus, semiconductor elements forming the high-voltage side switching circuit and the low-voltage side rectifier circuit, the transformer, and the like generate heat. When a temperature is increased due to generation of heat, a loss is increased. Therefore, a container that houses electronic components forming the transformer and the circuits has a heat-radiating structure.

As the DC-DC converter apparatus, the following structure is known.

A circuit board is attached to a base plate made of metal. An opening is provided in a part of the circuit board, and a transformer is placed in the opening and is mounted on the base plate. A cover made of metal is combined with the base plate in which the circuit board and the transformer are housed. A protrusion portion protruding inward is provided in a top plate portion of the cover. The protrusion portion of the cover is brought into press-contact with the transformer, and the transformer is sandwiched between the base plate and the cover (for example, see PTL 1).

CITATION LIST

Patent Literature

PTL 1: JP-A-2007-6635

SUMMARY OF INVENTION

Technical Problems

In a structure described in PTL 1, a transformer and a circuit board are hermetically provided in a space having no partition, and therefore the structure malfunctions or a property thereof is deteriorated due to an electromagnetic noise generated from a high-voltage side switching circuit, a low-voltage side rectifier circuit, the transformer, and the like.

The structure is such that a protrusion portion of a cover is brought into press-contact with the transformer and the transformer is sandwiched between a base plate and the cover, and therefore the transformer may be broken due to shock, vibration, or the like.

Solution to Problems

A DC-DC converter apparatus of the invention includes: a transformer; a high-voltage side circuit board assembly connected to a primary side of the transformer and forming a high-voltage side circuit; a low-voltage side circuit board assembly connected to a secondary side of the transformer and forming a low-voltage side circuit; a control circuit board assembly forming a control circuit for controlling the high-voltage side circuit and the low-voltage side circuit; a case housing the transformer, the high-voltage side circuit board assembly, the low-voltage side circuit board assembly, and the control circuit board assembly; a metal frame placed in the case and placed between the transformer and the control circuit board assembly; and an elastic member interposed between the metal frame and the transformer, in which the transformer is pressed and fixed to a bottom portion side of the case by the elastic member interposed between the metal frame and the transformer.

Advantageous Effects of Invention

According to the invention, an electromagnetic noise from a transformer is shielded by a metal frame placed between a control circuit board assembly and the transformer. Further, the transformer is pressed and fixed to a bottom portion side of a case by the metal frame via an elastic member. This makes it possible to reduce possibility of breakage of the transformer caused by shock or vibration.

DESCRIPTION OF EMBODIMENT

External Appearance of DC-DC Converter Apparatus

Hereinafter, an embodiment of a DC-DC converter apparatus of the invention will be described with reference to drawings.

Figure 1:
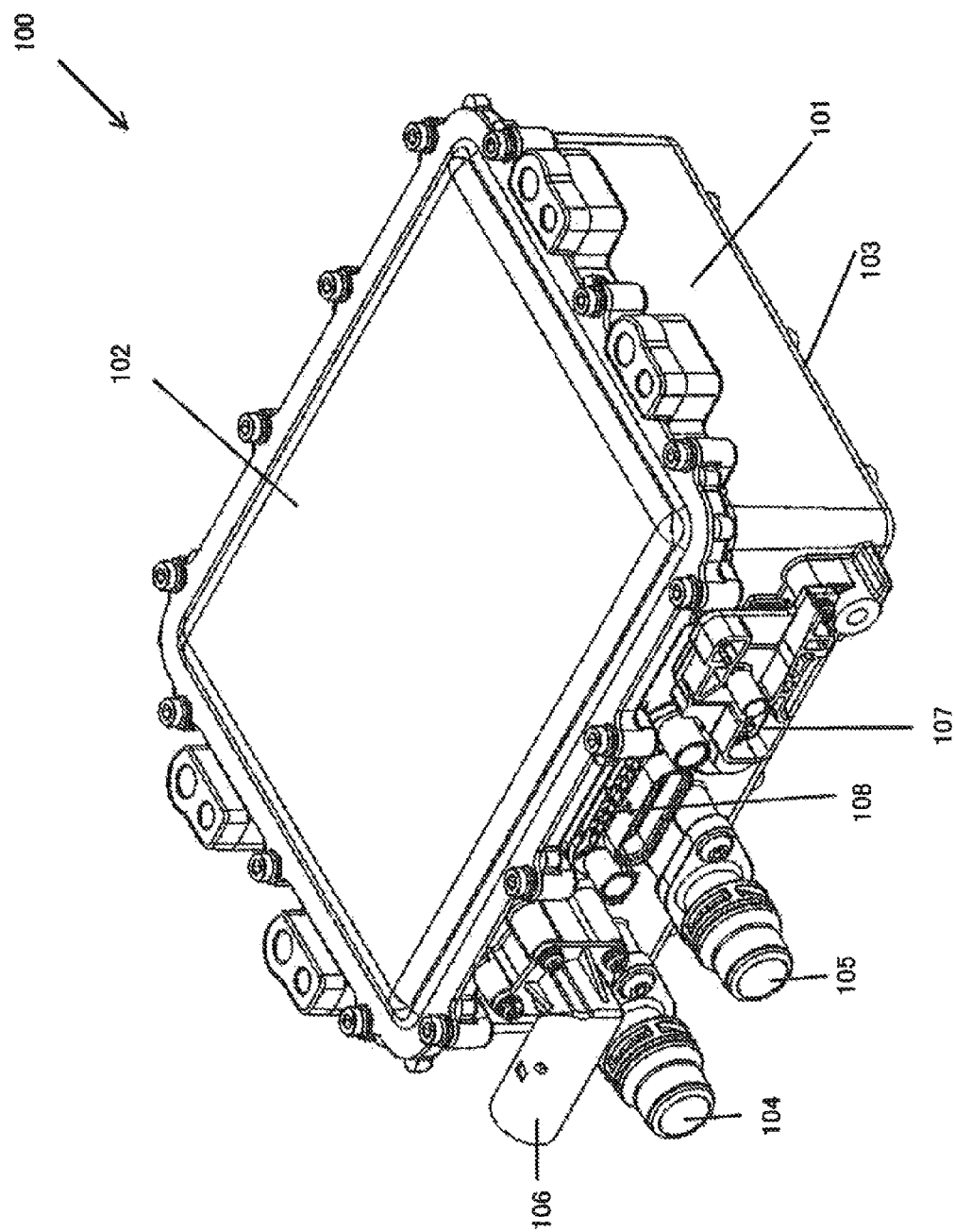
FIG. 1 is an external appearance perspective view illustrating an embodiment of a DC-DC converter apparatus of the invention.

FIG. 1 is an external appearance perspective view of a DC-DC converter apparatus 100 of the invention.

The DC-DC converter apparatus 100 is applied to an electric vehicle, a plug-in hybrid vehicle, and the like. The vehicle includes a low voltage storage battery for operating auxiliaries such as a light and a radio. The DC-DC converter apparatus 100 performs power conversion from a high voltage storage battery to the low voltage storage battery or performs power conversion from the low voltage storage battery to the high voltage storage battery.

A circuit for performing the power conversion is housed in a case 101.

An upper surface lid 102 is attached on an upper side of the case 101 by fastening members such as bolts. A bottom portion 101a (see FIG. 11) is integrally provided on a lower side of the case 101, and a lower surface lid 103 is attached to the case 101 by fastening members such as bolts so as to have a predetermined space from the bottom portion 101a.

Although details will be described below, a cooling channel 351 (see FIG. 13) through which a cooling medium such as cooling water or cooling gas flows is provided in the space between the bottom portion 101a of the case 101 and the lower surface lid 103. A sealing member such as an O-ring (not illustrated) is interposed between the case 101 and the lower surface lid 103 and is structured to enclose the cooling medium.

The case 101, the upper surface lid 102, and the lower surface lid 103 are individually formed by, for example, aluminum die casting.

An inlet, pipe 104 serving as a guide for causing the cooling medium to flow into the cooling channel 351 and an outlet pipe 105 serving as a guide for causing the cooling medium to flow out from the cooling channel 351 are attached to one side surface of the case 101.

In the one side surface of the case 101, an input connector 106 to be connected to a wiring for supplying power having a high voltage high voltage from the high voltage storage battery to a power conversion circuit provided in the case 101 is introduced from an opening (not illustrated) provided in the case 101.

An output connector 107, to which a wiring for outputting a DC low voltage from the power conversion circuit provided in the case 101 is connected, is provided in the one side surface of the case 101. Further, a signal connector 108, to which a signal wiring for transmitting/receiving a signal having low power to/from the power conversion circuit provided in the case 101 is connected, is provided in the one side surface of the case 101.

The input connector 106, the output connector 107, and the signal connector 108 may be individually provided on different side surfaces of the case 101.

[Circuit Configuration of DC-DC Converter Apparatus]

A circuit configuration of the DC-DC converter apparatus 100 will be described.

Figure 2:
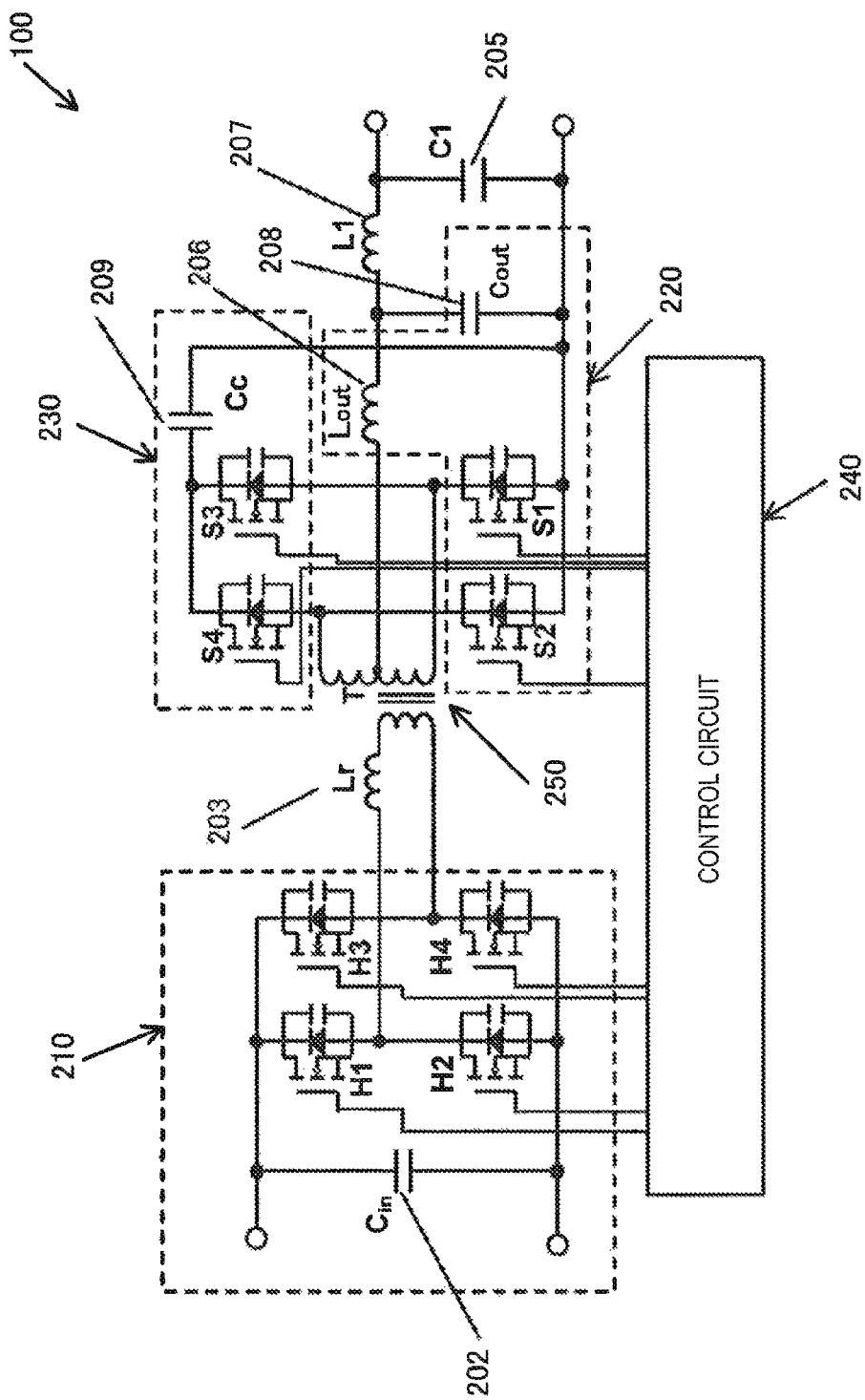
FIG. 2 illustrates an embodiment of a circuit configuration of the DC-DC converter apparatus illustrated in FIG. 1.

FIG. 2 is a circuit configuration view of the DC-DC converter apparatus of the invention. The DC-DC converter apparatus 100 has a high-voltage side switching circuit (high-voltage side circuit) 210 for converting a DC voltage having a high voltage into an AC voltage, transformer 250 for converting an AC high voltage into an AC low voltage, and a low-voltage side rectifier circuit (low-voltage side circuit) 220 for converting an AC voltage having a low voltage into a DC voltage.

The DC-DC converter apparatus 100 of the embodiment has an active clamp circuit 230 for suppressing a surge voltage applied to MOSFETs (field effect transistor) $S_1$ and $S_2$ of the low-voltage side rectifier circuit 220. The active clamp circuit 230 has active clamp MOSFETs $S_3$ and $S_4$ and an active-clamp capacitor 209 ($C_c$). The DC-DC converter apparatus 100 does not necessarily need to have the active clamp circuit 230.

A resonance choke coil 203 ($L_r$) is connected between the high-voltage side switching circuit 210 and the transformer 250. Zero voltage switching of MOSFETs forming the high-voltage side switching circuit 210 can be performed with the use of a combined inductance of an inductance of the resonance choke coil 203 and a leakage inductance of the transformer 250.

A filter coil 207 ($L_1$) and a filter capacitor 205 ($C_1$) are provided on an output side of the low-voltage side rectifier circuit 220 in order to remove a noise superimposed on an output voltage.

Note that the resonance choke coil 203, the filter coil 207, and the filter capacitor 205 are not necessarily needed, and, although efficiency may be reduced and a noise may be increased, the DCDC converter apparatus having a circuit configuration that does not include them can also convert power.

Switching control of the high-voltage side switching circuit 210, the low-voltage side rectifier circuit 220, and the active clamp circuit 230 is performed by a control circuit 240.

(Circuit Configuration of High-Voltage Side Switching Circuit)

The high-voltage side switching circuit 210 includes four MOSFETs $H_1$ to $H_4$ connected as an H-bridge type and a smoothing input capacitor 202 ($C_{in}$). A snubber capacitor is provided in parallel in each of the MOSFETs $H_1$ to $H_4$.

By subjecting the four MOSFETs $H_1$ to $H_4$ of the high-voltage side switching circuit 210 to phase shift PWM control, an AC voltage is generated in a primary side of the transformer 250.

(Circuit Configuration of Low-Voltage Side Rectifier Circuit)

The low-voltage side rectifier circuit 220 has two rectification phases formed by the MOSFETs $S_1$ and $S_2$ and a smoothing circuit formed by a choke coil 206 ($L_{out}$) and a smoothing capacitor 208 ($C_{out}$). High-potential sides of the respective rectification phases (i.e., drain-side wirings of the MOSFETs $S_1$ and $S_2$ are connected to a secondary side of the transformer 250. A secondary side center tap terminal of the transformer 250 is connected to the choke coil 206 ($L_{out}$), and the smoothing capacitor 208 ($C_{out}$) is connected to an output side or the choke coil 206 ($L_{out}$).

[Whole Structure of DC-DC Converter Apparatus]

Figure 3:
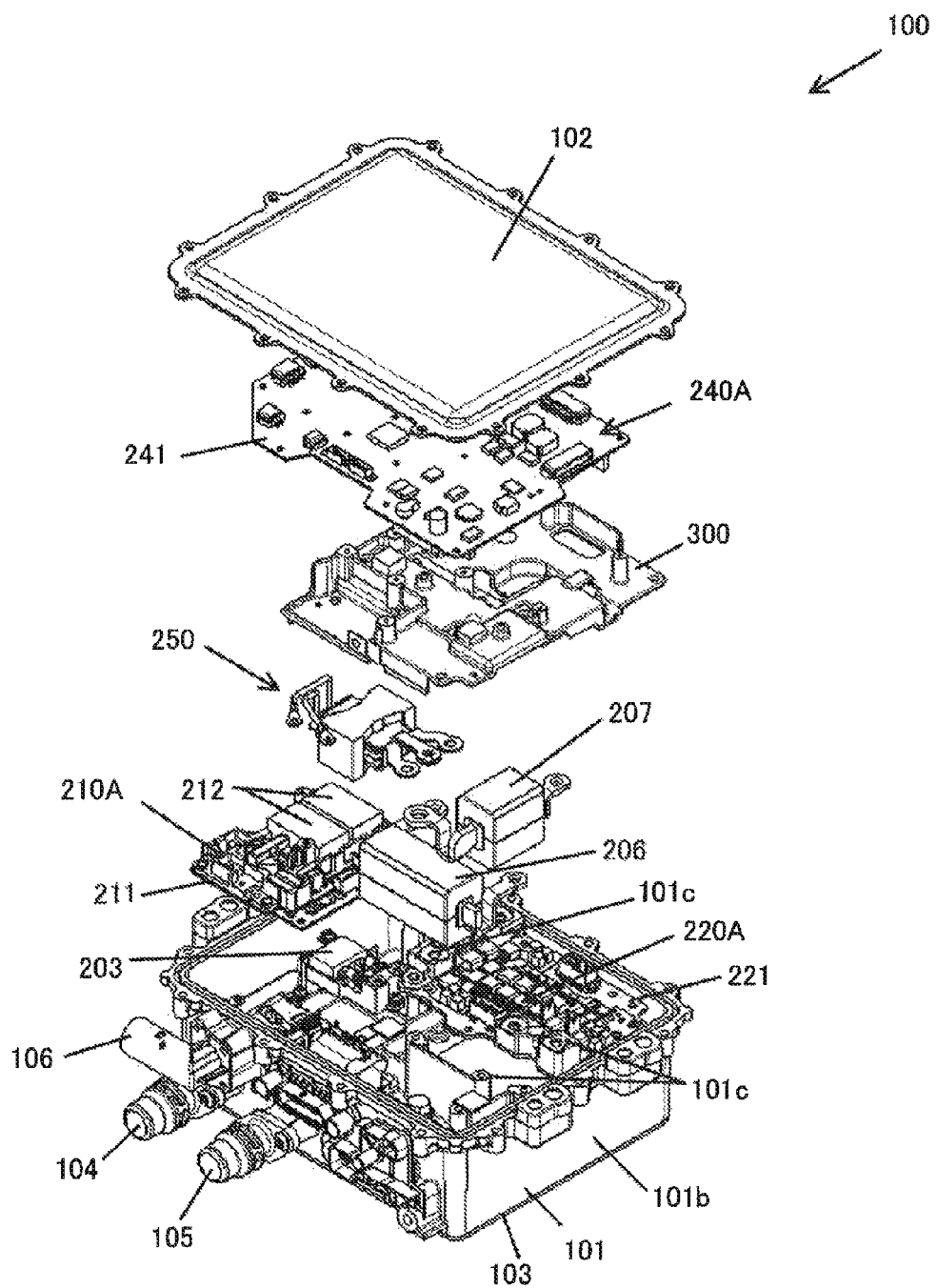
FIG. 3 is an exploded perspective view of the DC-DC converter apparatus illustrated in FIG. 1.

FIG. 3 is an exploded perspective view of the DC-DC converter apparatus illustrated in FIG. 1.

The case 101 is made of aluminum-based metal such as aluminum or aluminum alloy. The case 101 is formed to have a box shape that is a substantially rectangular parallelepiped shape and has a side surface 101b therearound. A high-voltage side circuit board assembly 210A, the transformer 250, the resonance choke coil 203, the choke coil 206, the filter coil 207, a low-voltage side circuit board assembly 220A, a metal frame 300, and a control circuit board assembly 240A are housed in the case 101.

The high-voltage side circuit board assembly 210A is structured, such that the MOSFETs $H_1$ to $H_4$ forming the high-voltage side circuit 210, a smoothing input capacitor 212, and electronic components (not illustrated) such as a gate resistor are mounted on a high-voltage side circuit board 211. The MOSFETs $H_1$ to $H_4$ mounted on the high-voltage side circuit board 211 are fixed to the bottom portion 101a of the case 101 via an insulating sheet (not illustrated) by fastening members (not illustrated). The insulating sheet (not illustrated) is fixed in a state in which one side surface thereof is in contact with the bottom portion 101a of the case 101 and is cooled by the cooling medium flowing through the cooling channel 351 provided on the bottom portion 101a side of the case 101.

The low-voltage side circuit board assembly 220A is structured such that the MOSFETs $S_1$ and $S_2$ forming the low-voltage side rectifier circuit 220, the smoothing capacitor 208 ($C_{out}$), and the active-clamp MOSFETs $S_3$ and $S_4$ forming the active clamp circuit 230, the active-clamp capacitor 209 ($C_c$), and electronic components (not illustrated) such as a gate resistor are mounted on a low-voltage side circuit board 221.

Although not illustrated, the low-voltage side circuit board 221 has a structure in which, for example, an insulating film is provided on one surface of a metal substrate and a wiring pattern is provided on the insulating film. Each of the MOSFETs $S_1$ to $S_4$ has a package structure in which a switching portion is sealed by resin and a drain terminal connected to a drain electrode is provided to one surface of the resin. The drain terminal of each of the MOSFETs $S_1$ to $S_4$ is soldered to a drain pattern of the metal substrate. An opposite surface of a mounting surface of the low-voltage side circuit board 221 is fixed to the bottom portion 101a of the case 101 directly or via a heat conduction member, and heat generated from each of the MOSFETs $S_1$ to $S_4$ is transmitted to the bottom portion 101a of the case 101 via the metal substrate. The heat transmitted to the bottom portion 101a of the case 101 is cooled by the cooling medium flowing through the cooling channel 351 provided on the bottom portion 101a side of the case 101.

The transformer 250, the choke coil 206, and the filter coil 207 are placed on the bottom portion 101a of the case 101 and are fixed by fastening members (not illustrated). The metal frame 300 is attached to cover the transformer 250, the choke coil 206, and the filter coil 207 housed in the case 101.

Although details will be described below, the transformer 250, the choke coil 206, and the filter coil 207 are fixed in a state in which the transformer 250, the choke coil 206, and the filter coil 207 are pressed to the bottom portion 101a of the case 101 by the metal frame 300.

In the bottom portion 101a of the case 101, which corresponds to an upper side of the high-voltage side circuit board assembly 210A, a recess not illustrated) is provided, and the resonance choke coil 203 is housed in the recess. The high-voltage side circuit board assembly 210A is placed on an upper side of the resonance choke coil 203.

The control circuit board assembly 240A is structured by mounting electronic components forming the control circuit 240 on a control circuit board 241 and is fixed on the metal frame 300 by fastening members (not illustrated). In the control circuit board assembly 240A, the upper surface lid 102 is fastened to the case 101 by the fastening members.

[Structure of Transformer]

Figure 4:
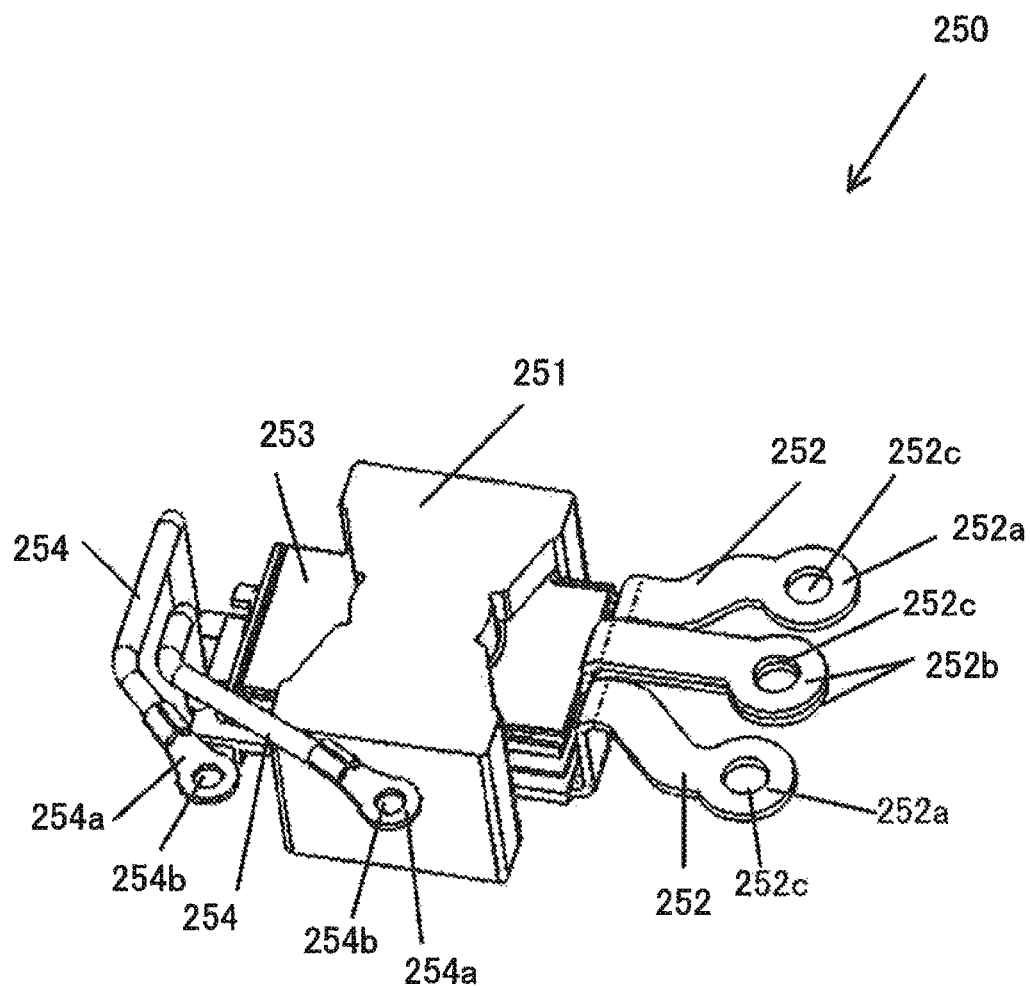
FIG. 4 is an enlarged perspective view of a transformer illustrated in FIG. 3.
Figure 5:
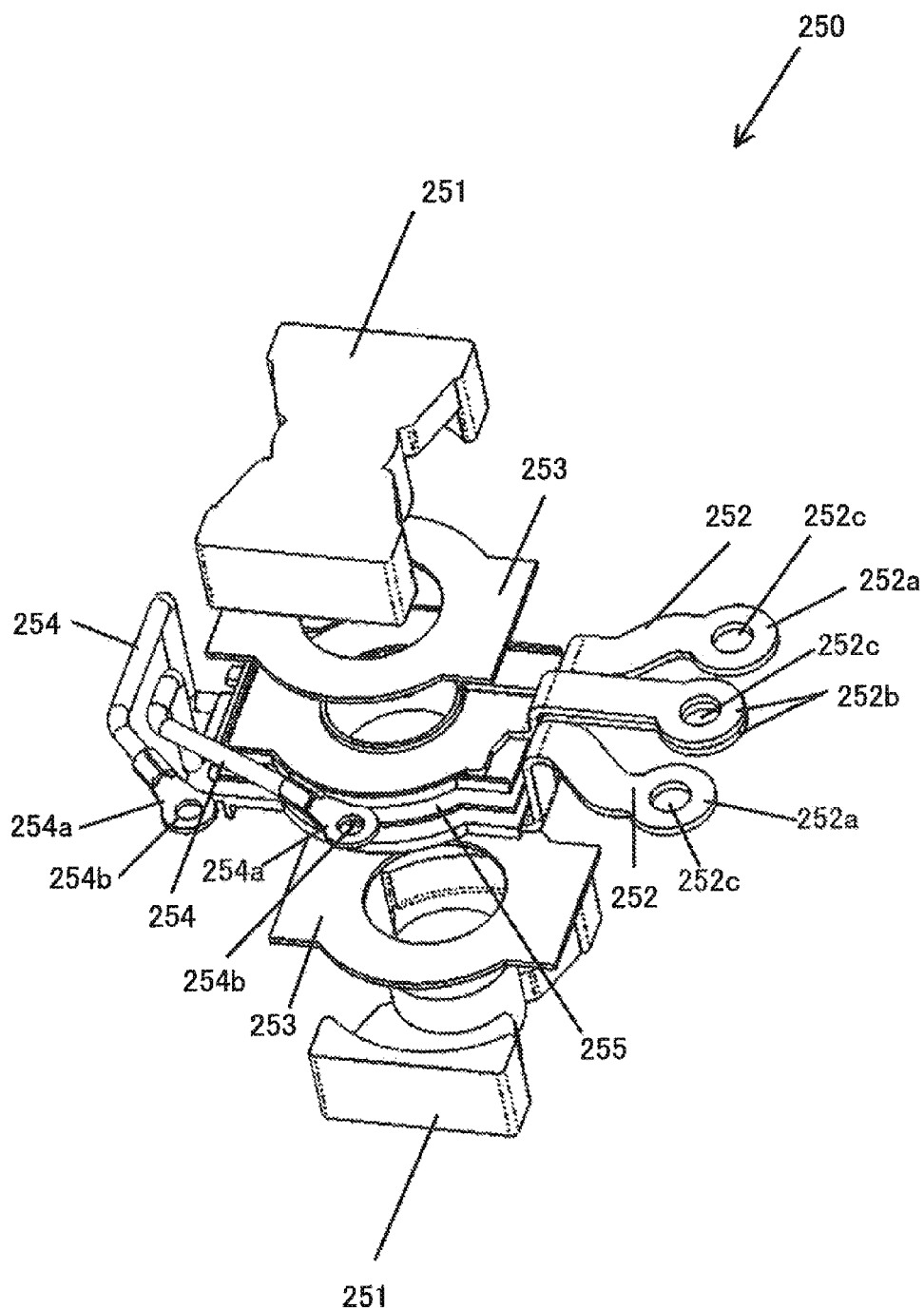
FIG. 5 is an exploded perspective view of the transformer illustrated in FIG. 4.

FIG. 4 is an enlarged perspective view of the transformer illustrated in FIG. 3. FIG. 5 is an exploded perspective view of the transformer illustrated in FIG. 4.

As illustrated in FIG. 5, the transformer 250 has a structure in which a bobbin 255 around which a primary winding 254 is wound and a pair of upper and lower secondary windings 252 are sandwiched by a pair of E-type cores 251.

A pair of terminals 254a are provided in the primary winding 254, and a through hole 254b chat allows a fastening member such as a bolt to be inserted thereinto is provided in each terminal 254a. Each of the secondary windings 252 is formed by subjecting a copper plate to press molding to integrally form a secondary winding part and a busbar. Each secondary winding 252 has a terminal 252a and a center tap terminal 252b in end portions thereof. The terminal 252a and the center tap terminal 252b have respective throughholes 252c each of which allows a fastening member such as a bolt to be inserted thereinto. The center tap terminals 252b of the upper and lower secondary windings 252 are stacked.

Heat transfer sheets 253 formed by material having elasticity, the material being made of silicon or the like, are provided between the upper core 251 and the secondary windings 252 and between the lower core 251 and the secondary windings 252, respectively.

As illustrated in FIG. 4, the cores 251 are formed to have a smaller width than the heat transfer sheets 253, and each of the heat transfer sheets 253 is exposed from side portions of the cores 251. The terminals 254a of the primary winding 254 and the terminals 252a and the center tap terminals 252b of the secondary windings 252 are extended toward sides of the heat transfer sheets 253.

One of the terminals 254a of the primary winding 254 of the transformer 250 is connected to the resonance choke coil 203 by the fastening member inserted through the corresponding through hole 254b. The other one of the terminals 254a of the primary winding 254 of the transformer 250 is electrically connected directly or via a busbar to the high-voltage side circuit, board assembly 210A by the fastening member inserted through the corresponding through hole 254b. The terminals 252a and the center tap terminals 252b of the secondary windings 252 of the transformer 250 are electrically connected directly or via a busbar to the low-voltage side circuit board assembly 220A by the fastening members inserted through the respective through holes 252c.

[Arrangement Structure in Case]

Figure 6:
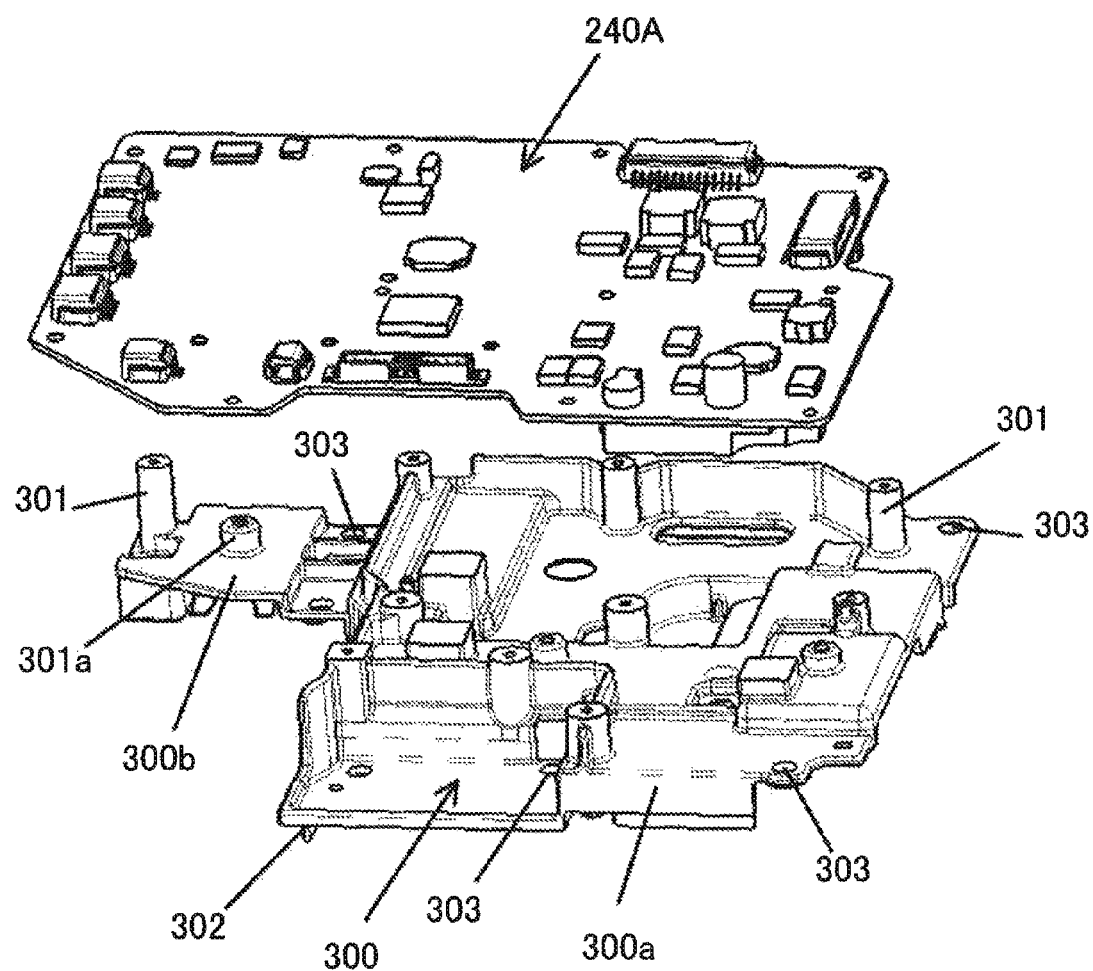
FIG. 6 is a perspective view of a control circuit board and a metal frame illustrated in FIG. 2.
Figure 7:
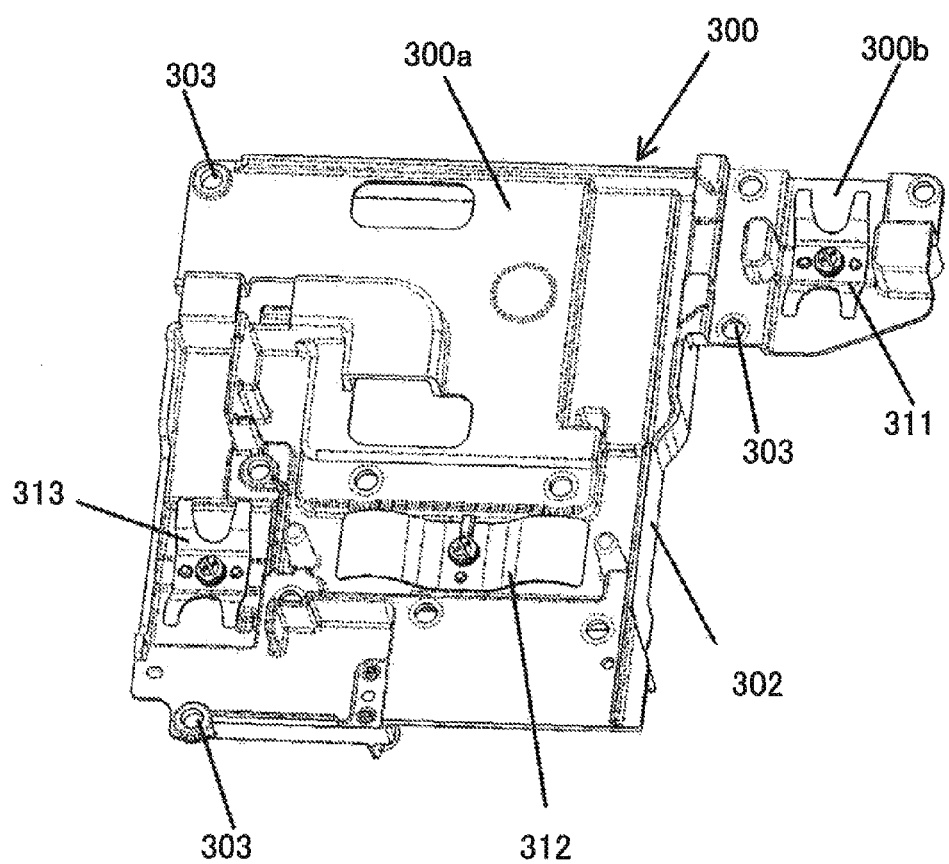
FIG. 7 is a perspective view of the metal frame illustrated in FIG. 6 seen from a back surface.
Figure 8:
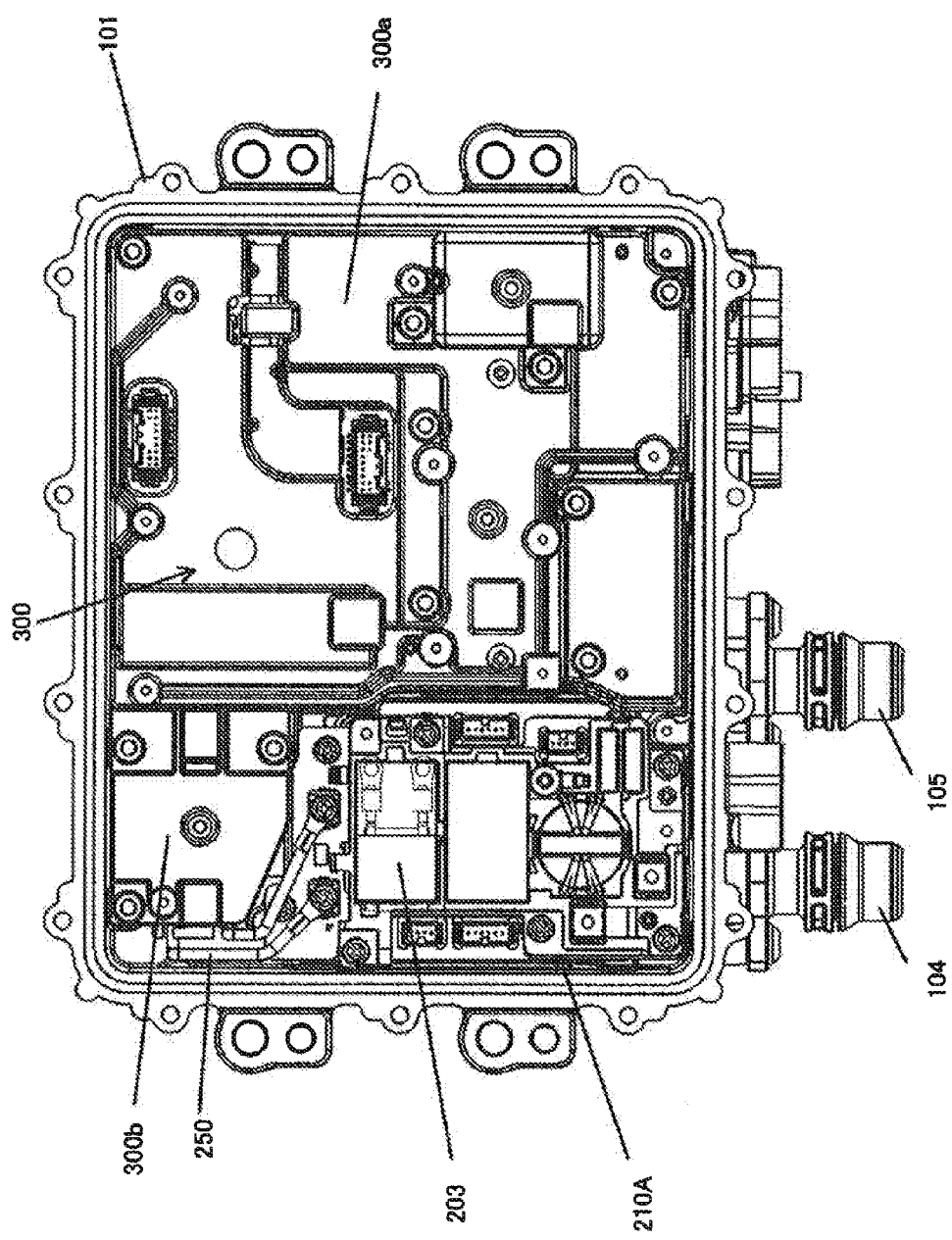
FIG. 8 is a plan view of a state in which a high-voltage side circuit board assembly and the metal frame are housed in a case.

FIG. 6 is a perspective view of the control circuit board and the metal frame illustrated in FIG. 2. FIG. 7 is a perspective view of metal frame illustrated in FIG. 6 seen from a back surface. FIG. 8 is a plan view of a state in which the high-voltage side circuit board assembly and the metal frame are housed in the case 9 is a plan view illustrating arrangement of internal components, in which the metal frame in FIG. 8 is transparent.

Figure 9:
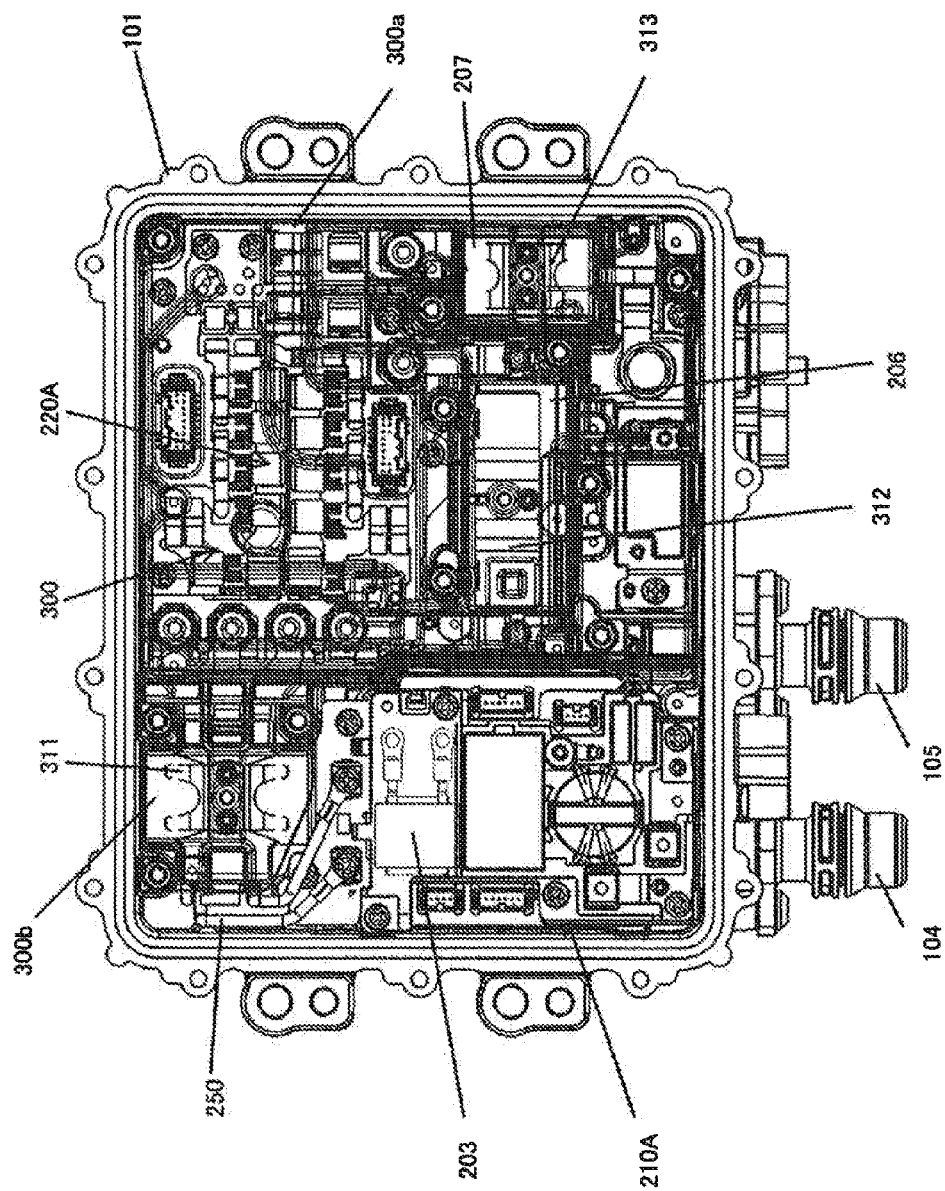
FIG. 9 is a plan view illustrating arrangement of internal components, in which the metal frame in FIG. 8 is transparent.

As illustrated in FIG. 9, the high-voltage side circuit board assembly 210A is placed at a lower left corner in the case 101. The transformer 250 is placed above the high-voltage side circuit board assembly 210A. An upper left corner of the transformer 250 is in close contact with an upper left corner of the case 101.

As described above, the resonance choke coil 203 is placed under the vicinity of the upper side of the high-voltage side circuit board assembly 210A. Note that FIG. 8 and FIG. 9 illustrate a state in which the upper side of the high-voltage side circuit board assembly 210A is removed and the resonance choke coil 203 is exposed.

The low-voltage side circuit board assembly 220A is arranged on a right side of the transformer 250. An upper right corner of the low-voltage side circuit board assembly 220A is in close contact with an upper right corner of the case 101. The choke coil 206 and the filter coil 207 are arranged in a right and left direction to be in close contact with a lower side of the low-voltage side circuit board assembly 220A so that the choke coil 206 is placed at a center of the case 101 and the filter coil 207 is in close contact with a right side of the case 101.

The metal frame 300 has a rectangular large area portion 300a covering the low-voltage side circuit board assembly 220A, the choke coil 206, and the filter coil 207 and a rectangular small area portion 300b extended from the large area portion 300a to cover the transformer 250. As illustrated, in FIG. 8, the small area portion 300b has such an area that covers only the transformer 250. The metal frame 300 has an area that covers all area in the case 101 other than a region where the high-voltage side circuit board assembly 210A is placed.

As illustrated in FIG. 6, a plurality of boss portions 301 planted toward the control circuit board assembly 240A are provided in the metal frame 300. The control circuit board assembly 240A is fastened and fixed by the fastening members (not illustrated) such as bolts to the boss portions 301 of the metal frame 300.

As illustrated in FIG. 7, three plate springs 311 to 313 are attached by fastening members such as bolts on an opposite surface side (back surface side) of the metal frame 300, the opposite surface side being opposite to a side on which the control circuit board assembly 240A is provided. The plate springs 311 to 313 are made of stainless steel. The plate spring 311 is attached on a back surface side of the small area portion 300b at a position corresponding to the transformer 250. The plate springs 312 and 313 are attached on a back surface side of the large area portion 300a at positions corresponding to the choke coil 206 and the filter coil 207, respectively, which are electronic components having a relatively larger weight.

A partition portion 302 bent toward the bottom portion 101a of the case 101 is provided on a side of the metal frame 300 on the high-voltage side circuit board assembly 210A side. The partition portion 302 is extended to a whole region of the small area portion 300b, and the small area portion 300b is closer to the bottom portion 101a of the case 101 than the large area portion 300a for a step of the partition portion 302.

A plurality of through holes 303 are provided in the metal frame 300 and are fixed, by fastening members (not illustrated) such as bolts inserted through the through holes 303, to boss portions 101c (see FIG. 3) planted in the bottom portion 101a of the case 101.

The control circuit board assembly 240A is attached on the metal frame 300 and the high-voltage side circuit board assembly 210A.

Figure 10:
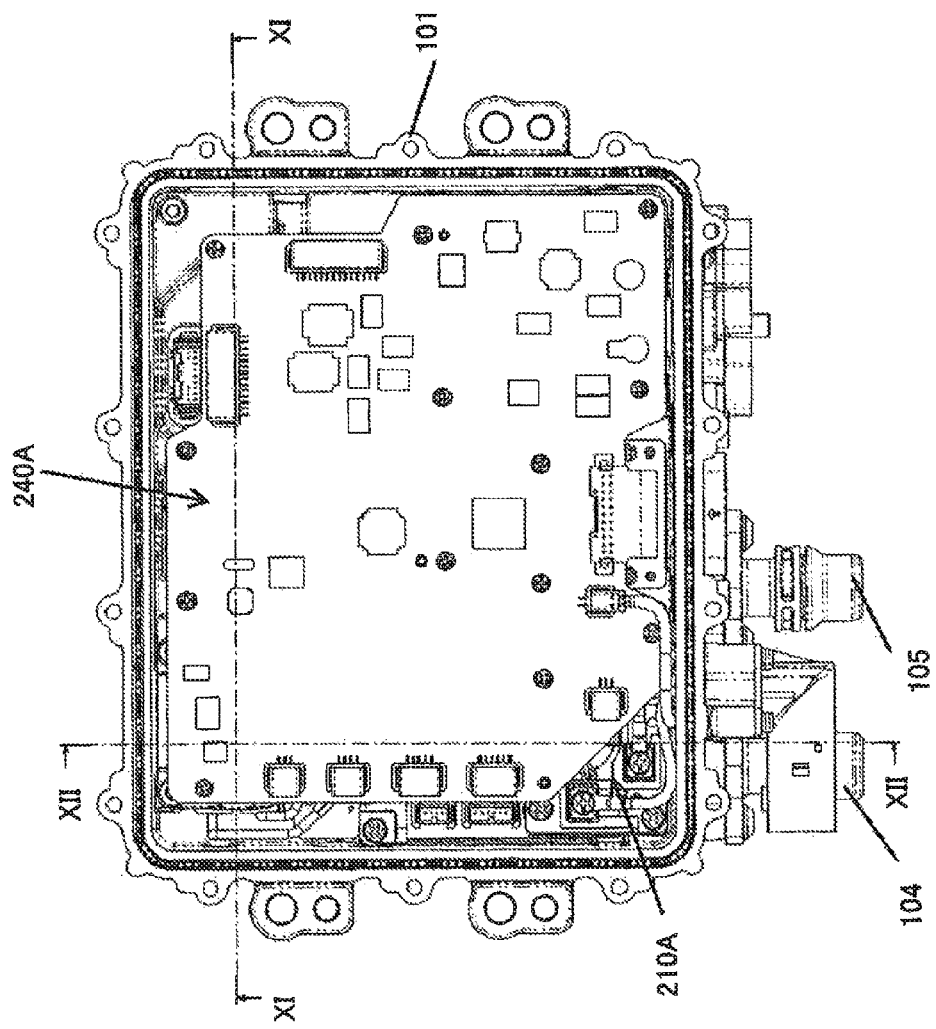
FIG. 10 is a plan view illustrating a state in which the control circuit board is attached on the high-voltage side circuit board assembly and the metal frame illustrated in FIG. 8.

FIG. 10 is a plan view illustrating a state in which the control circuit board assembly 240A is attached on the high-voltage side circuit board assembly 210A and the metal frame 300 illustrated in FIG. 8.

As described above, the control circuit board assembly 240A is fixed to the boss portions 301 of the metal frame 300 by the fastening members such as bolts.

With the structure, the control circuit board assembly 240A is separated by the metal frame 300 from the transformer 250, the low-voltage side circuit board assembly 220A, the choke coil 206, and the filter coil 207. Therefore, the control circuit board assembly 240A is shielded from an electromagnetic noise generated from the transformer 250, the low-voltage side circuit board assembly 220A, the choke coil 206, and the filter coil 207.

[Fixing Structure of Transformer]

An embodiment of a fixing structure of the transformer 250 will be described.

Figure 11:
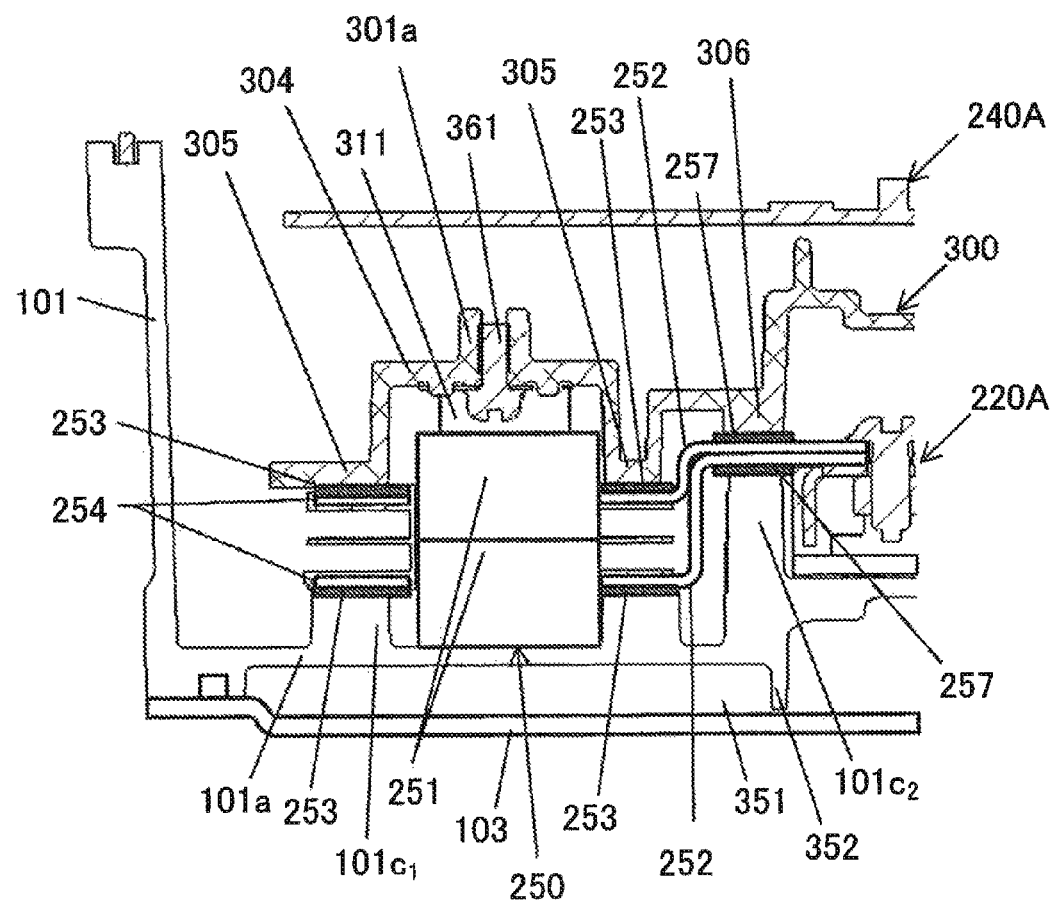
FIG. 11 is a cross-sectional view taken along the line XI-XI of FIG. 10.
Figure 12:
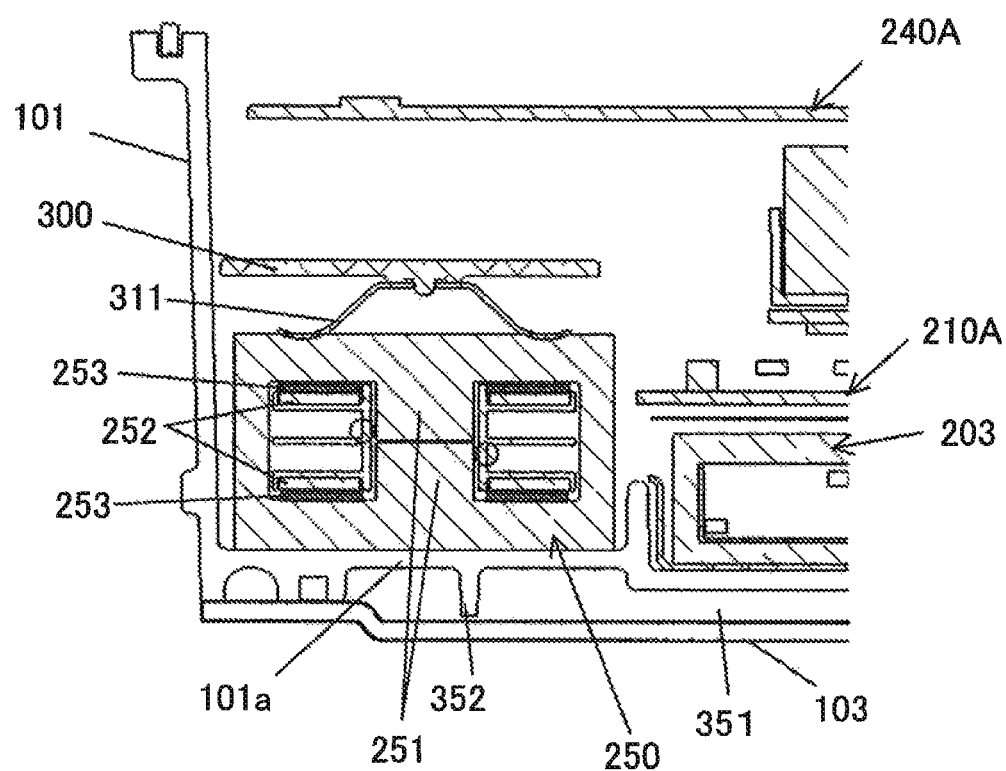
FIG. 12 is a cross-sectional view taken along the line XII-XII of FIG. 10.

FIG. 11 is a cross-sectional view taken along the line XI-XI of FIG. 10, and FIG. 12 is a cross-sectional view taken along the line XII-XII of FIG. 10.

A protrusion portion 304 is provided in a region corresponding to the cores 251 of the transformer 250 in the metal frame 300. A boss portion 301a directed to outside which is an upper side of FIG. 11 is provided in the protrusion portion 304. The plate spring 311 is attached inside the protrusion portion 304. The plate spring 311 is attached to the metal frame 300 by a fastening member 361 such as a bolt screwed with a female screw portion provided in the boss portion 301a.

The plate spring 311 presses the cores 251 of the transformer 250 to the bottom portion 101a of the case 101 in a state in which the metal frame 300 is fixed to the case 101. With this, the transformer 250 is fixed between the plate spring 311 and the bottom port on 101a of the case 101.

In this state, a heat-radiating contact portion 305 surrounding the protrusion portion 304 of the metal frame 300 is brought into contact with the upper heat transfer sheet 253. A boss portion $101c_1$ provided in the bottom portion 101a of the case 101 is brought into contact with the lower heat transfer sheet 253.

Therefore, heat generated from the secondary windings 252 of the transformer 250 is transmitted to the metal frame 300 via the cores 251 and the plate spring 311 and is then radiated. Further, the heat generated from the secondary windings 252 of the transformer 250 is transmitted to the metal frame 300 via the heat transfer sheets 253 and is then radiated.

Heat transfer sheets 257 made of material having elasticity, such as silicon, are placed on the busbars which are the upper and lower secondary windings 252 of the transformer 250. The upper heat transfer sheet 257 is brought into contact with a heat-radiating abutting portion 306 of the metal frame 300, and the lower heat transfer sheet 257 is brought into contact with a boss portion $101c_2$ provided in the bottom portion 101a of the case 101.

The cooling channel 351 through which the cooling medium is circulated is provided between the bottom portion 101a of the case 101 and the lower surface lid 103.

Therefore, heat generated from the transformer 250 is transmitted to the bottom portion 101a of the case 101 via the heat transfer sheets 253 and 257 and is cooled by the cooling medium flowing through the cooling channel 351.

As described above, the plate springs 312 and 313 attached to the metal frame 300 correspond to an upper portion of the choke coil 206 and an upper portion of the filter coil 207, respectively.

The choke coil 206 and the filter coil 207, as well as the transformer 250, are pressed and fixed to the bottom portion 101a of the case 101 by the plate springs 312 and 313, respectively, in a state in which the metal frame 300 is fixed to the case 101. Therefore, heat generated from the choke coil 206 and the filter coil 207 is also transmitted to the metal frame 300 or the case 101 and is cooled by the cooling medium flowing through the cooling channel 351.

[Structure of Cooling Channel]

Cooling capability for cooling, with the use of the cooling medium, heat generated from power-supply electronic components such as the transformer 250, the resonance choke coil 203, the choke coil 206, the filter coil 207, the high-voltage side circuit board assembly 210A, and the low-voltage side circuit board assembly 220A can be improved in terms of efficiency by a structure of the cooling channel.

Hereinafter, an embodiment of the structure of the cooling channel which can improve cooling efficiency will be described.

Figure 13:
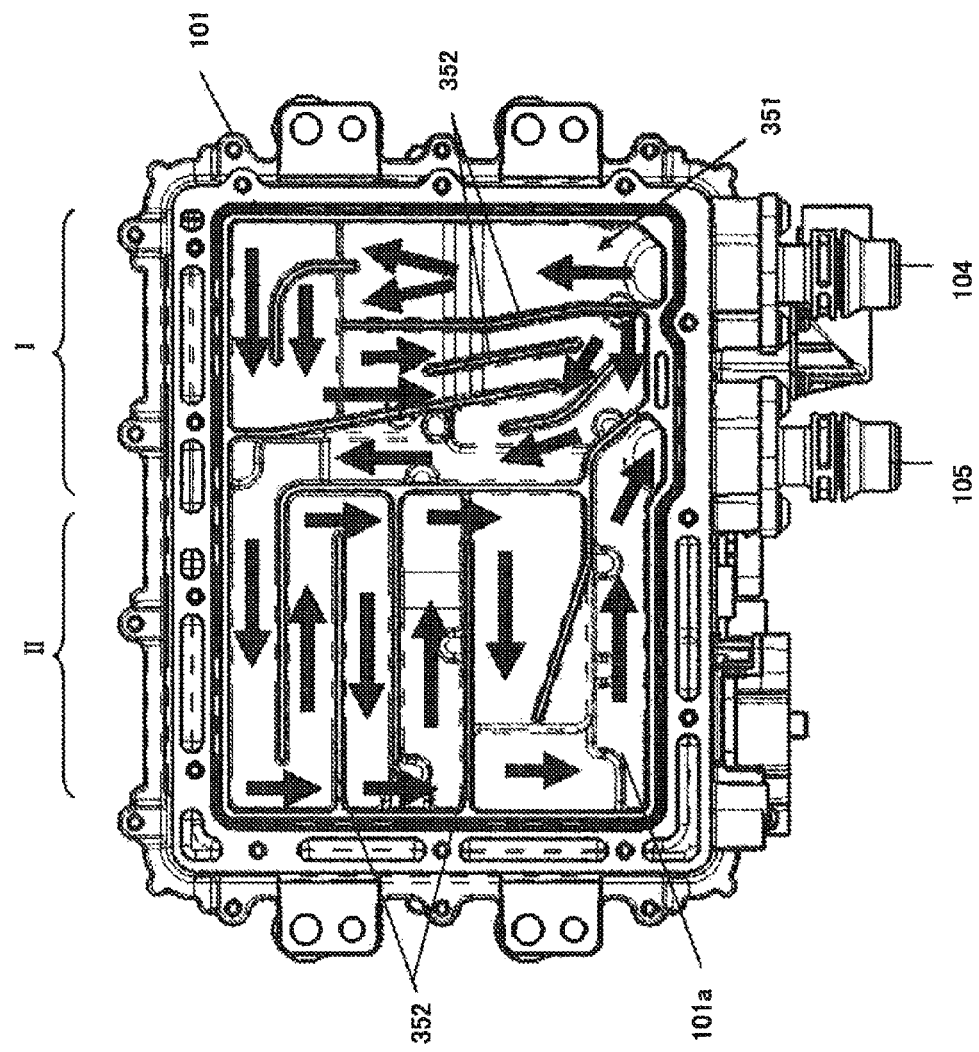
FIG. 13 is a plan view of a cooling channel provided in a bottom portion of the case.
Figure 14:
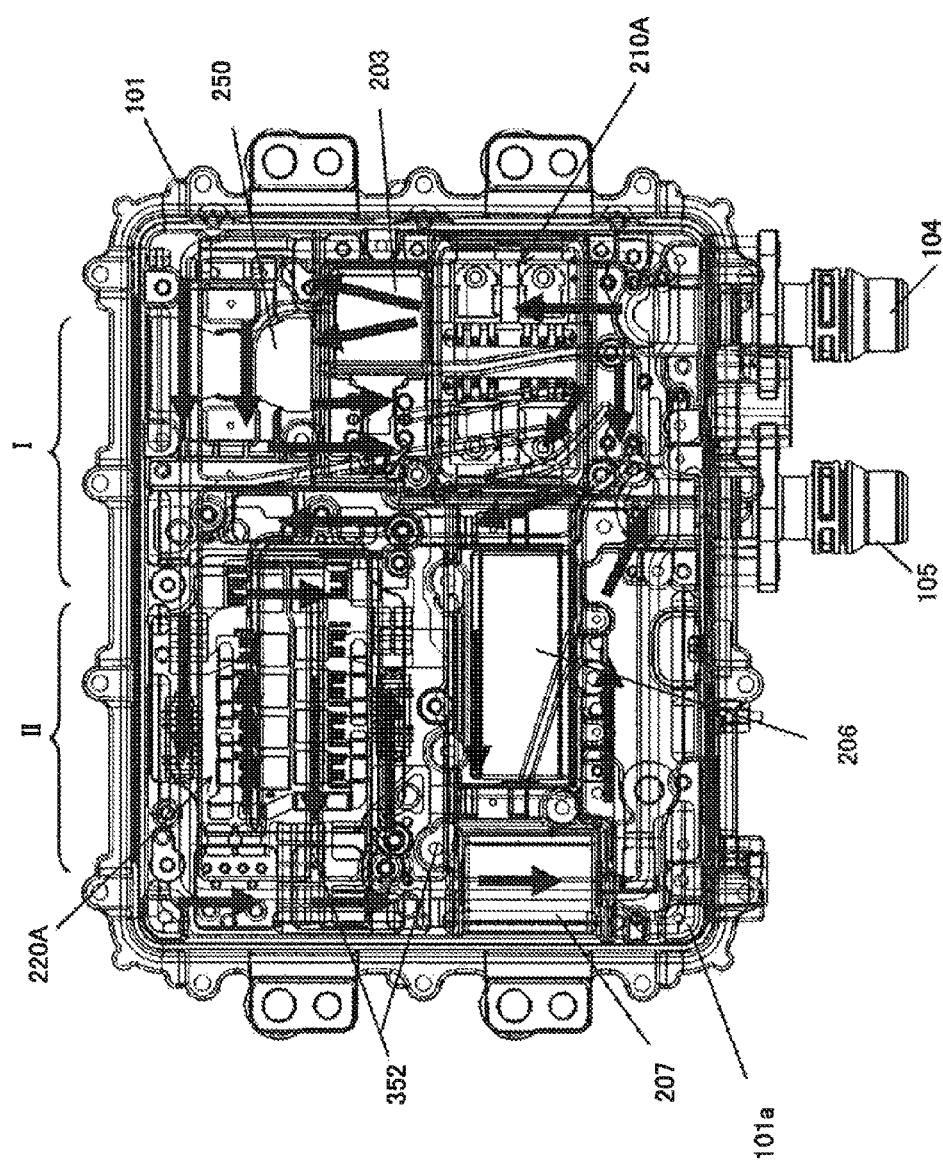
FIG. 14 is a plan view for describing a relationship between the arrangement of the internal components and the cooling channel, in which the bottom portion of the case is transparent.

FIG. 13 is a plan view of the cooling channel provided in the bottom portion of the case, and FIG. 14 is a plan view showing a relationship between arrangement of the internal components and the cooling channel, in which the bottom portion of the case is transparent. Note that, in FIG. 13 and FIG. 14, the lower surface lid 103 is removed.

As illustrated in FIG. 13, a plurality of guide walls 352 serving as guides of a flow direction of the cooling medium flowing through the cooling channel 351 are integrally formed with the case 101 in the bottom portion 101a of the case 101.

The cooling channel 351 has a region I and a region II each of which allows the cooling medium to be returned. Specifically, after the cooling medium flowing from an inlet pipe 204 flows up and down in the region I in an up and down direction of FIG. 13 and FIG. 14 and also flows up and down in the up and down direction in the region II, i.e., after the cooling medium is returned in each of the regions, the cooling medium flows out from the outlet pipe 105.

As illustrated in FIG. 14, the high-voltage side circuit board assembly 210A, the resonance choke coil 203, and the transformer 250 are placed in the region I of the cooling channel 351 so that the high-voltage side circuit board assembly 210A is provided on the inlet pipe 104 side.

The choke coil 206, the filter coil 207, and the low-voltage side circuit board assembly 220A are placed in the region II of the cooling channel 351. The choke coil 206 and the filter coil 207 are arrayed on the outlet pipe 105 side in a right and left direction, and the low-voltage side circuit board assembly 220A is arrayed above the choke coil 206 and the filter coil 207.

The cooling medium flowing into the region I of the cooling channel 351 from the inlet pipe 104 cools the high-voltage side circuit board assembly 210A, the resonance choke coil 203, and the transformer 250. Then, the cooling medium flows from a position where the cooling medium is returned to the inlet pipe 104 side into the region II and flows toward the low-voltage side circuit board assembly 220A side. Thereafter, the cooling medium flows in the region II in the right and left direction to sequentially cool the low-voltage side circuit board assembly 220A, the choke coil 206, and the filter coil 207 to thereby reach the outlet pipe 105.

The cooling medium flowing from the inlet pipe 104 has not absorbed yet heat from the power-supply electronic components housed in the case 101 and therefore has a low temperature. This makes it possible to efficiently cool the high-voltage side circuit board assembly 210A, the resonance choke coil 203, and the transformer 250 having a large heat generation amount.

As described above, the cooling medium cools the power-supply electronic components having a large heat generation amount, and then the cooling medium flows into the region II to sequentially cool the low-voltage side circuit board assembly 220A, the choke coil 206, and the filter coil 207.

The cooling capability also relates to a depth of the cooling channel 351. In a shallow cooling channel 351a, a flow rate of the cooling medium becomes faster and a flow amount thereof is increased, and therefore the cooling capability is increased. Therefore, it is preferable to improve the whole cooling capability, i.e., it is preferable to improve the cooling efficiency in such a way that the depth of the cooling channel 351 in a region of a component on which the cooling capability should be largely exerted is formed so that the depth is shallower than that in a surrounding region to decrease the flow amount of the cooling medium.

Effects of Embodiment

According to the embodiment, the following effects can be obtained.

(1) A substrate assembly forming a power conversion circuit portion of the DC-DC converter apparatus 100 is divided into the high-voltage side circuit board assembly 210A, the low-voltage side circuit board assembly 220A, and the control circuit board assembly 240A. The control circuit board assembly 240A is separated by the metal frame 300 from the transformer 250, the low-voltage side circuit board assembly 220A, the choke coil 206, and the filter coil 207. Therefore, the control circuit board assembly 240-A can be shielded from an electromagnetic noise generated from the transformer 250, the low-voltage side circuit board assembly 220A, the choke coil 206, and the filter coil 207.

(2) The transformer 250, the choke coil 206, and the filter coil 207 having a large weight are pressed to the bottom portion 101 of the case 101 by the plate springs 311, 312, and 313 attached to the metal frame 300, respectively, and are fixed between the respective plate springs 311 to 313 and the bottom portion 101a.

Because the plate springs 311 to 313 have the elasticity, it is possible to reduce a possibility of breakage of the transformer 250, the choke coil 206, and the filter coil 207 even in a case where shock or vibration is applied to the DC-DC converter apparatus 100.

(3) The plate springs 311 to 313 are formed by a metal member having thermal conductivity such as stainless steel. Therefore, heat generated from the transformer 250, the choke coil 206, and the filter coil 207 can be transmitted to the metal frame 300 and can be then radiated.

(4) The transformer 250 has a structure in which the heat transfer sheets 253 are included immediately below the pair of upper and lower cores 251 and has a structure in which the heat-radiating abutting portion 306 of the metal frame 300 is brought into contact with the upper beat transfer sheet 253. With this, heat generated from the secondary windings 252 of the transformer 250 is transmitted to the metal frame 300 via the core 251 and is also directly transmitted to the heat-radiating abutting portion 306 of the metal frame 300 and is then radiated. This improves a heat-radiating property from the transformer 250 to the metal frame 300. Further, because the heat transfer sheets 253 are integrally provided with the transformer 250, it is possible to efficiently perform repair and disassembly and assembly at the time of service.

(5) The heat transfer sheet 257 is interposed between the upper secondary winding 252 of the transformer 250 and the heat-radiating abutting portion 306 of the metal frame 300. This makes it possible to transmit the heat generated from the secondary windings 252 of the transformer 250 to the metal frame 300 also via the heat-radiating abutting portion 306. Therefore, the heat-radiating property is improved.

(6) The boss portion 101c₁ provided in the bottom portion 101a of the case 101 is brought into contact with the lower heat transfer sheet 253 of the transformer 250. This makes it possible to transmit the heat generated from the transformer 250 to the bottom portion 101a of the case 101 via the heat transfer sheet 253. Therefore, the heat-radiating property of the transformer 250 is improved.

(7) The heat transfer sheet 257 is interposed between the lower secondary winding 252 of the transformer 250 and the boss portion 101c₂ provided in the bottom portion 101a of the case 101. This makes it possible to transmit the heat generated from the transformer 250 to the metal frame 300 via the heat transfer sheet 257. Therefore, the heat-radiating property of the transformer 250 is improved.

(8) The cooling channel 351 through which the cooling medium flows is provided between the bottom portion 101a of the case 101 and the lower surface lid 103. Therefore, heat generated in the transformer 250, the resonance choke coil 203, the choke coil 206, and the filter coil 207 to be transmitted to the case 101 can be cooled by the cooling medium flowing through the cooling channel 351.

(9) The insulating sheet (not illustrated) of the high-voltage side circuit board assembly 210A and the metal substrate of the low-voltage side circuit board 221 in the low-voltage side circuit board assembly 220A are brought into contact with the bottom portion 101a of the case 101. Therefore, heat generated from the MOSFETs H₁ to H₄ of the high-voltage side circuit board assembly 210 the MOSFETs S₁ to S₄ of the low-voltage side circuit board assembly 220A, and the like can be transmitted to the bottom portion 101a of the case 101 and can be efficiently cooled by the cooling medium flowing through the cooling channel 351. As the insulating sheet, it is possible to use a silicon rubber sheet or a ceramic plate made of silicon nitride or the like, which has high thermal conductivity.

Note that the embodiment has exemplified rectifying elements in the low-voltage side rectifier circuit 220 as the MOSFETs S₁ and S₂. However, the rectifying elements may be replaced with diodes. Further, each rectification phase has been exemplified as a circuit configured by a single rectifying element. However, each rectification, phase may be configured by a circuit in which a plurality of rectifying elements are connected in parallel.

The embodiment has exemplified a structure in which the transformer 250, the choke coil. 206, and the filter coil 207 are fixed by the plate springs 111 to 113 to the bottom portion 101a of the case 101. However, cushion members made of insulating resin may be used instead of the plate springs 111 to 113. That is, any member may be used as long as the member has the elasticity.

As members for pressing the choke coil 206 and the filter coil 207 to the bottom portion 101a of the case 101, the elastic members are not necessarily needed, and the choke coil 206 and the filter coil 207 may be pressed by the metal frame 300 itself. That is, at least the transformer 250 needs to be pressed and fixed by the elastic member to the bottom portion 101a of the case 101.

The embodiment has exemplified a structure in which the transformer 250, the control circuit board assembly 240A, the high-voltage side circuit board assembly 210A, and the lower-voltage side circuit board assembly 220A are mutually shielded by the metal frame 300. However, at least the control circuit board assembly 240A needs to be shielded from an electromagnetic noise from the transformer 250 by the metal frame 300.

The embodiment has exemplified the case 101 having a structure in which the cooling channel 351 is provided between the bottom portion 101a and the lower surface lid 103. However, the DC-DC converter apparatus 100 that does not include the cooling channel 351 may be formed by fastening the bottom portion 101a of the case 101 with the use of a cooling jacket provided in another device such as an inverter device to which the DC-DC converter apparatus 100 is connected.

The embodiment has exemplified the plate spring 311 as a structure fixed to the metal frame 300. However, a cushion member or the like may be used instead of the plate spring 311 and the cushion, member may be structured to be fixed to the transformer 250 by adhesion or the like.

The embodiment has exemplified a structure in which the transformer 250 and the like are directly fixed to the bottom portion 101a of the case 101. However, a heat conductive member may be attached between the transformer 250 and the like and the bottom portion 101a of the case 101 and the transformer 250 and the like may be pressed to the heat conductive member. That is, the transformer 250 and the like only need to be structured to be pressed and fixed to the bottom portion 101a side of the case 101 by the elastic members interposed between the metal frame 300 and the transformer 250 and the like.

As described above, the DC-DC converter apparatus 100 that does not include the resonance choke coil 203 and the filter coil 207 may be formed. On the contrary, the DC-DC converter apparatus 100 to which other electronic components such as the filter capacitor 205 are added may be formed.

In addition, the invention may be variously modified and applied within the scope of the invention. That is, the invention only needs to have a structure in which a metal frame is placed between a transformer placed in a case and a control circuit board assembly, an elastic member is interposed between the metal frame and the transformer, and the transformer is pressed and fixed to a bottom portion side of the case by the elastic member interposed between the metal frame and the transformer.

REFERENCE SIGNS LIST

100 DC-DC converter apparatus
101 case
101a bottom portion
101c boss portion
101c₁, 101c₂ boss portion
104 inlet pipe
105 outlet pipe
203 resonance choke coil
206 choke coil
207 filter coil
210 high-voltage side switching circuit
210A high-voltage side circuit board assembly
220 low-voltage side rectifier circuit
220A low-voltage side circuit board assembly
240 control circuit
240A control circuit board assembly
250 transformer
251 core
252 secondary winding
253, 257 heat transfer sheet
254 primary winding
300 metal frame
301 boss portion
302 partition portion
305 heat-radiating contact portion
306 heat-radiating abutting portion

311 to 313 plate spring
351 cooling channel
$S1_a$ to $S1_d$, $S2_a$ to $S2_d$ MOSFET (field effect transistor)

The invention claimed is:

1. A DC-DC converter apparatus, comprising:
   a low-voltage side circuit board assembly:
   a transformer;
   a control circuit board assembly forming a control circuit for controlling a circuit connected to the transformer;
   a case housing the transformer and the control circuit board assembly;
   a metal frame placed in the case and placed between the transformer and the control circuit board assembly; and
   an elastic member interposed between the metal frame and the transformer, wherein:
   the transformer is pressed and fixed to a bottom portion side of the case by the elastic member interposed between the metal frame and the transformer,
   wherein the metal frame has a rectangular large area portion covering the low-voltage side circuit board assembly and the metal frame has a rectangular small area portion extended from the large area portion covering only the transformer, and
   wherein the metal frame has a heat-radiating abutting portion that is brought into contact with a busbar connected to a secondary winding of the transformer.

2. The DC-DC converter apparatus according to claim 1, wherein
   the elastic member is a spring member.

3. The DC-DC converter apparatus according to claim 1, wherein
   the elastic member is made of resin.

4. The DC-DC converter apparatus according to claim 1, wherein
   the case includes a cooling channel for cooling the transformer on the bottom portion side.

5. The DC-DC converter apparatus according to claim 1, wherein
   the transformer includes a heat transfer sheet, and the metal frame has a heat-radiating contact portion that is brought into contact with the heat transfer sheet.

6. The DC-DC converter apparatus according to claim 1, further comprising
   a choke coil, wherein the choke coil is pressed and fixed to the bottom portion side of the case by the metal frame via an elastic member interposed between the metal frame and the choke coil.

7. The DC-DC converter apparatus according to claim 1, further comprising
   a filter coil, wherein the filter coil is pressed and fixed to the bottom portion side of the case by an elastic member interposed between the metal frame and the filter coil.

8. The DC-DC converter apparatus according to claim 1, wherein
   the case has a plurality of boss portions protruding toward the control circuit board assembly, and the metal frame is fixed to the plurality of boss portions.

9. The DC-DC converter apparatus according to claim 1, further comprising
   a high-voltage side circuit board assembly connected to a primary side of the transformer and forming a high-voltage side circuit;
   wherein the metal frame is shaped so that the high-voltage side circuit board assembly is exposed.

10. The DC-DC converter apparatus according to claim 9, wherein the metal frame has a total area covering all area in the case other than a region where the high-voltage side circuit board assembly is positioned.

* * * * *